United States Patent
Chen et al.

(10) Patent No.: US 6,902,973 B2
(45) Date of Patent: Jun. 7, 2005

(54) HEMI-SPHERICAL GRAIN SILICON ENHANCEMENT

(75) Inventors: Shenlin Chen, Boise, ID (US); Jianping Zhang, Centreville, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/643,520

(22) Filed: Aug. 18, 2003

(65) Prior Publication Data

US 2005/0042823 A1 Feb. 24, 2005

(51) Int. Cl.⁷ .......................................... H01L 21/8242
(52) U.S. Cl. ...................... 438/255; 438/492; 438/684; 257/296; 257/301
(58) Field of Search .................. 438/255, 245, 438/492, 398, 388, 393, 396, 684; 257/296, 301

(56) References Cited

U.S. PATENT DOCUMENTS

| | | | |
|---|---|---|---|
| 5,405,801 A | * 4/1995 | Han et al. | 438/386 |
| 5,407,534 A | 4/1995 | Thakur | 156/662 |
| 5,418,180 A | 5/1995 | Brown | 437/60 |
| 5,658,381 A | 8/1997 | Thakur et al. | 257/309 |
| 5,721,171 A | 2/1998 | Ping et al. | 438/398 |
| 5,786,250 A | * 7/1998 | Wu et al. | 438/254 |
| 6,448,129 B1 | 9/2002 | Cho et al. | 438/241 |
| 2002/0064956 A1 | * 5/2002 | Wu et al. | 438/692 |
| 2003/0102469 A1 | * 6/2003 | Jones et al. | 257/9 |

FOREIGN PATENT DOCUMENTS

JP       2002222871     *  8/2002  .......  H01L/21/8242

* cited by examiner

Primary Examiner—Caridad Everhart

(57) ABSTRACT

Hemi-spherical grain silicon enhancement with epitaxial silicon for semiconductor assemblies is described. Epitaxial silicon is used to enhance hemi-spherical grain silicon on semiconductor structures, such as storage node capacitor plates for a semiconductor assembly. Methods described include forming an optional amorphous silicon layer as a base to firm hemi-shperical grain silicon thereon. The rough texture of the hemi-spherical grain silicon enhances the overall textured surface of the capacitor plate by the addition of epitaxial silicon.

59 Claims, 6 Drawing Sheets

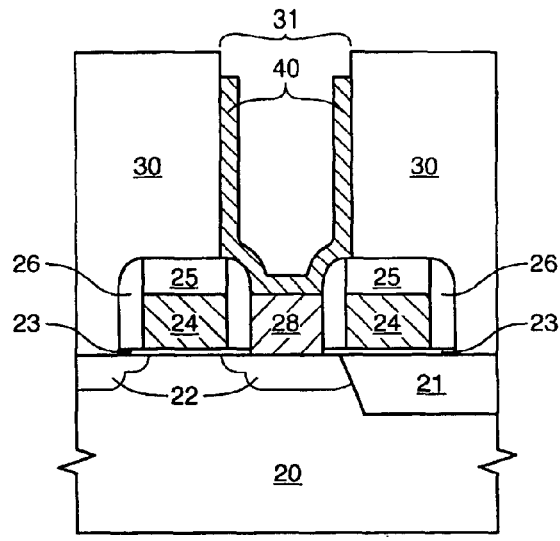
FIG. 4
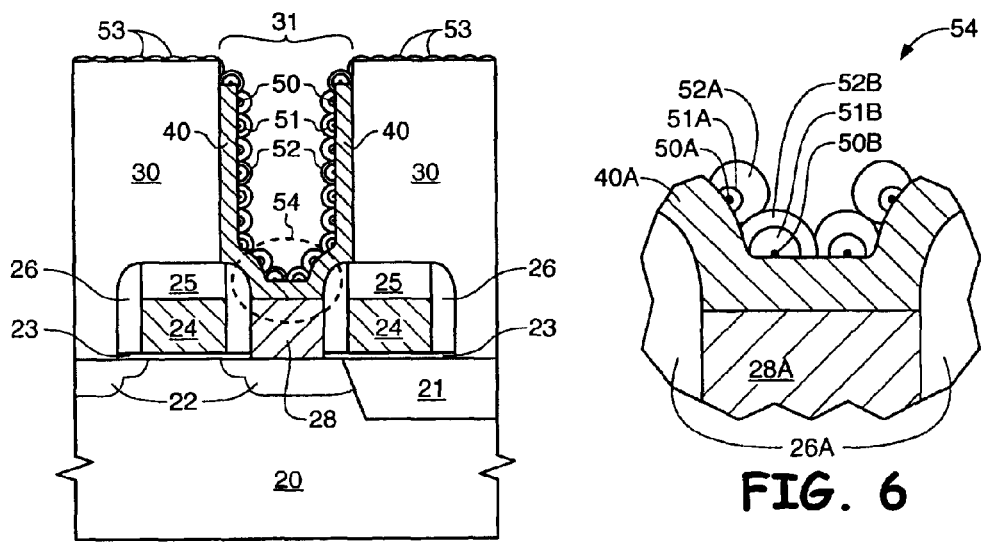
FIG. 5
FIG. 6

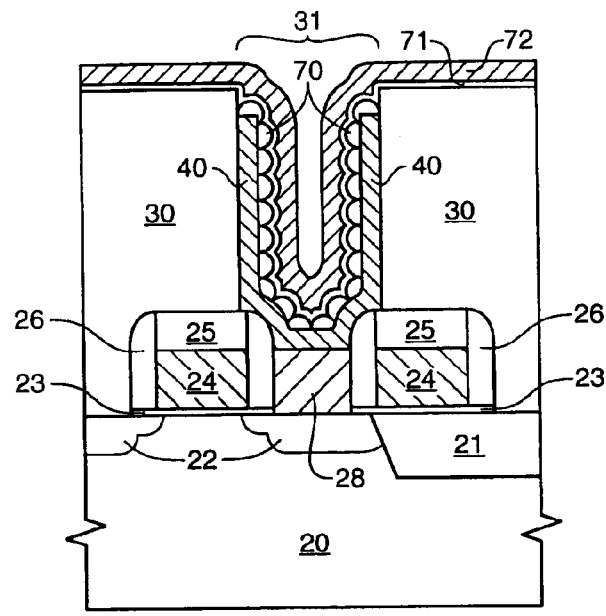
FIG. 7
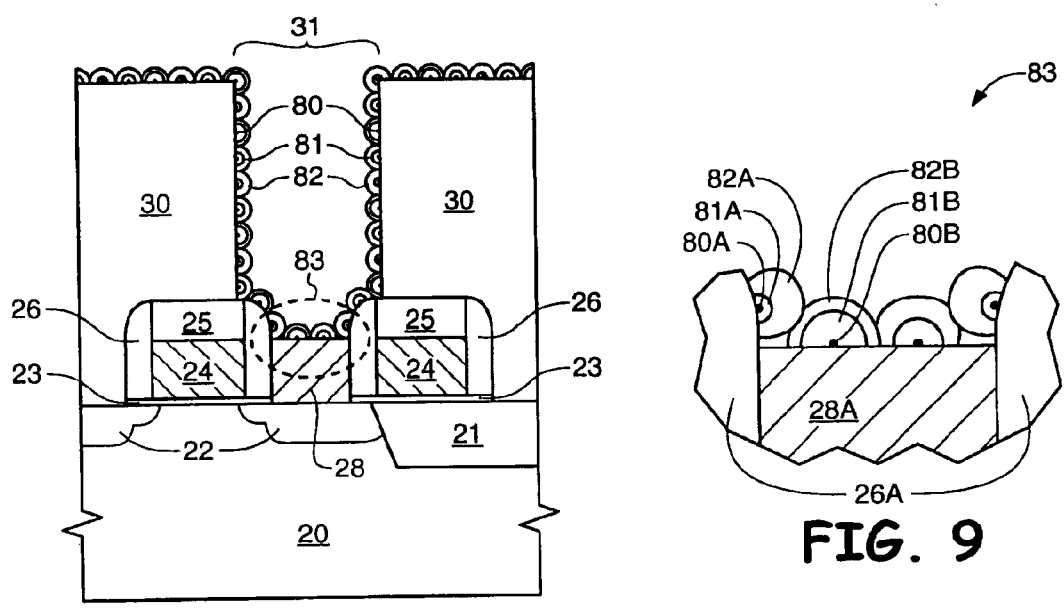
FIG. 8
FIG. 9

HEMI-SPHERICAL GRAIN SILICON ENHANCEMENT

FIELD OF THE INVENTION

This invention relates to semiconductor fabrication processing and, more particularly, to a method for forming epitaxial silicon enhanced hemi-spherical grain silicon for semiconductor devices, such as dynamic random access memories (DRAMs).

BACKGROUND OF THE INVENTION

The continuing trend of scaling down integrated circuits has motivated the semiconductor industry to consider new techniques for fabricating precise components at sub-micron levels. Along with the need for smaller components, there has been a growing demand for devices consuming less power. In the manufacture of memory devices, these trends have led the industry to refine approaches to achieve thinner capacitor cell dielectric and surface enhanced storage capacitor electrodes.

In dynamic random access memory (DRAM) devices it is essential that storage node capacitor cell plates be large enough to exhibit sufficient capacitance in order to retain an adequate charge in spite of parasitic capacitance and noise that may be present during circuit operation. As is the case for most semiconductor integrated circuitry, circuit density is continuing to increase at a fairly constant rate.

The issue of maintaining storage node capacitance is particularly important as the density of DRAM arrays continues to increase for future generations of memory devices. The ability to densely pack storage cells while maintaining required capacitance levels is a crucial requirement of semiconductor manufacturing technologies if future generations of expanded memory array devices are to be successfully manufactured.

One area of manufacturing technology that has emerged has been in the development of Hemi-Spherical Grain (HSG) silicon. HSG silicon enhances storage capacitance when used to form the storage node electrode without increasing the area required for the cell or the storage electrode height. The available methods known to those skilled in the art include use of Low Pressure Chemical Vapor Deposition (LPCVD) to deposit thin silicon films (conductively doped and non-doped silicon films) to form a rough surface. One method adds the silicon seeding and anneal steps in-situ and another method performs the silicon seeding and anneal in separate LPCVD systems. Methods to form HSG silicon, known to those skilled in the art, are utilized in conjunction with the several embodiments of the present invention that enhance the roughness of HSG silicon.

Embodiments of the present invention describe structures and the formation thereof which utilize hemi-spherical grain silicon material, the size and shape of which is enhanced by the use of epitaxial silicon, to be used in semiconductor structures for semiconductor assemblies, which will become apparent to those skilled in the art from the following disclosure.

SUMMARY OF THE INVENTION

Exemplary implementations of the present invention include hemi-spherical grain enhancement with epitaxial silicon for semiconductor assemblies, such as storage node capacitor plates for a semiconductor assembly and methods of forming thereof, comprising an optional amorphous silicon layer directly connecting to an underlying conductive material, such as a conductive polysilicon plug, a hemi-spherical grain silicon laying directly on the amorphous silicon layer and an epitaxial silicon laying directly on the hemi-spherical grain silicon.

BRIEF DESCRIPTION OF THE DRAWING

FIG. 4 is a subsequent cross-sectional view taken from FIG. 3 following the formation and planarization of the amorphous silicon layer, after which the amorphous silicon layer is etched back below the upper level of the BPSG.

FIG. 5 is a cross-sectional view taken from FIG. 4 following the formation of a hemi-spherical grain silicon on the amorphous silicon layer and the formation of epitaxial silicon on the hemi-spherical grain silicon, the combination of which is shown in an accompanying expanded view.

FIG. 6 is an enlarged cross-sectional view taken from a region outlined in FIG. 5.

FIG. 7 is a cross-sectional view taken from FIG. 5 following the formation of a conformal storage cell dielectric layer and the formation of a top storage cell electrode.

FIG. 8 is a subsequent cross-sectional view taken from FIG. 3 following the formation of hemi-spherical grain silicon along the upper surface and sidewalls of the BPSG material and on the exposed polysilicon plug, as well as the formation of epitaxial silicon on the hemi-spherical grain silicon.

FIG. 9 is an enlarged cross-sectional view taken from a region outlined in FIG. 8.

DETAILED DESCRIPTION OF THE INVENTION

Exemplary implementations of the present invention are directed to processes for forming epitaxial enhanced HSG silicon and structures utilizing the epitaxial enhanced HSG silicon in a semiconductor device as depicted in the embodiment of FIGS. 2–7 and the embodiment of FIGS. 2–3 and 8–10.

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

Figure 1:
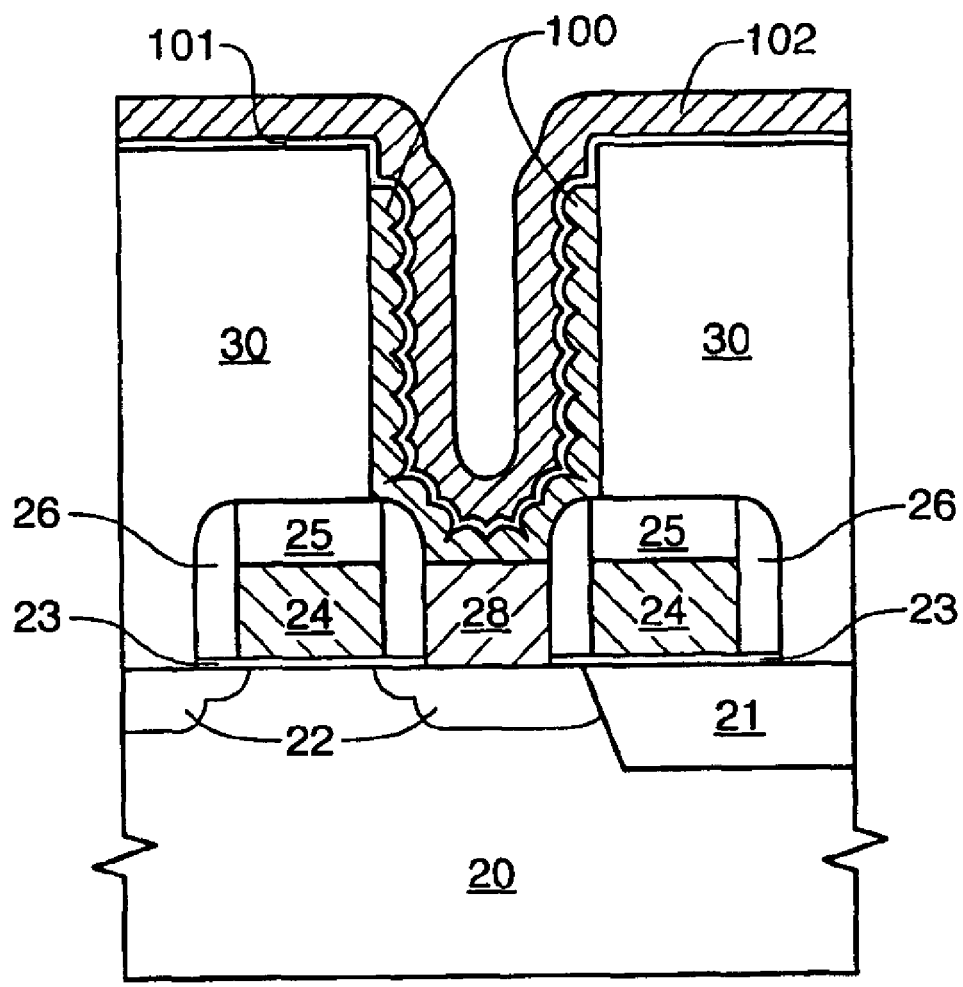
FIG. 1 is a cross-sectional view of a semiconductor substrate section showing an example of a completed storage cell having a container capacitor structure of an embodiment of the present invention.

FIG. 1 depicts a representation of a completed storage cell incorporating an embodiment of the present invention. Seen in FIG. 1 is substrate 20 on which has been formed field effect transistors (FETs), comprising source/drain region 22, transistor gate oxide 23, conductive transistor gates 24 isolated by materials 25 and 26, such as nitride. Source drain region 22 of a field effect transistor is isolated from a neighboring source/drain region of an adjacent field effect transistor (not shown) by field oxide or trench isolation material 21. As explained below, isolation material 30 is planarized and a hole provided therein to allow conductive plug 29 to connect to source/drain region 22. A capacitor storage node plate 29, having a roughened surface, sits atop and connects to conductive plug 28. A conformal storage cell dielectric 101 covers capacitor storage node plate 29 and the bordering exposed isolation material 30. Finally, a storage capacitor top plate 102 overlies cell dielectric 101 to complete the storage cell structure. Fabrication methods to form the storage cell structure of FIG. 1 are described below.

Figure 2:
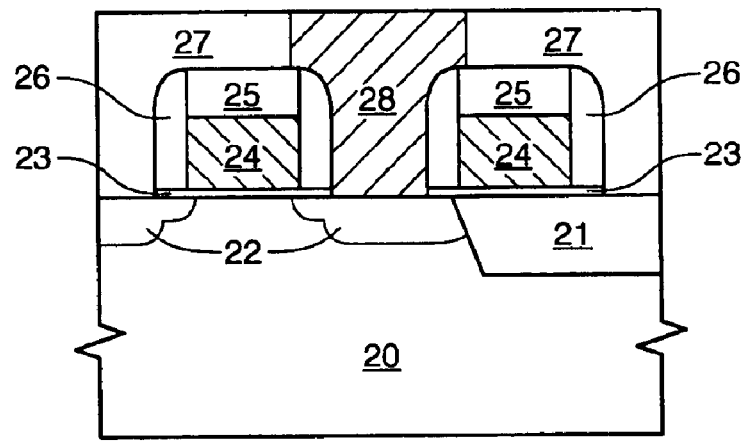
FIG. 2 is a cross-sectional view of a semiconductor substrate section depicting storage cell access transistors with an overlying planarized isolation material having a hole etched therein that is filled with a polysilicon plug which in turn connects to an underlying source/drain region of an access transistor.

Referring to FIG. 2, substrate 20 is prepared for the processing steps of the present embodiment. Substrate 20 may be a silicon material, such as a conductively doped silicon wafer. Processing steps known by one skilled in the art are used to form field effect transistors (FETs), comprising source/drain regions 22, transistor gate oxide 23 and conductive transistor gates 24 isolated by materials 25 and 26, such as nitride. Adjacent field effect transistors are isolated from one another by field oxide or trench isolation material 21 and isolation material 27, such as borophosphosilicate glass (BPSG), is formed over the FETs, planarized and a hole etched therein to expose the underlying source/drain region 22. Next, a conductive polysilicon (poly) material is deposited and planarized to form poly plug 28.

Figure 3:
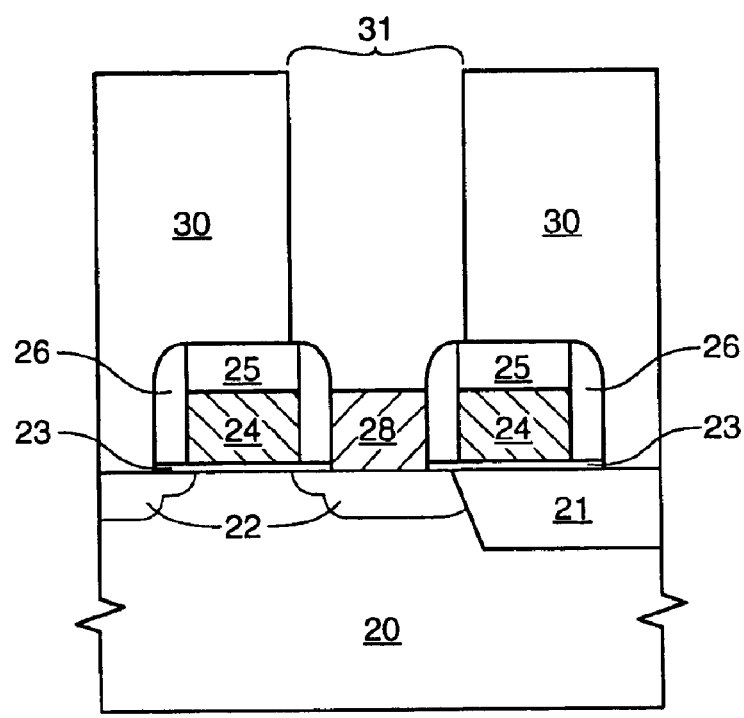
FIG. 3 is a subsequent cross-sectional view taken from FIG. 2 following the formation of a borophosphosilicate glass (BPSG) material (or any kind of insulating materials) and the subsequent patterning and etching of an opening to provide access to the underlying polysilicon plug.

Referring now to FIG. 3, a second isolation material 30, such as BPSG, is formed on the surface of isolation material 27 and poly plug 28. Isolation material 30 now incorporates isolation material 27 seen in FIG. 2. Isolation material 30 is patterned and etched to form an opening 31 therein and to provide access to poly plug 28. A following poly etch recesses poly plug 28 somewhat to ensure all overlying isolation material (i.e., oxide) is removed from the poly plug.

Referring now to FIG. 4, a conformal layer of amorphous silicon 40 is formed on the exposed surface of isolation material 30, into opening 31 along the sidewalls of isolation material 30, on any exposed portion of isolation materials 25 and 26 and on the surface of poly plug 28. An amorphous silicon layer having a preferred thickness of about 200–500 Angstroms may be formed by decomposing $SiH_4$ at approximately 500° C.

Amorphous silicon 40 may be a conductively doped material, a non-conductively doped material, or a combination of doped and non-conductively doped amorphous silicon layers. Amorphous silicon 40 will serve as a silicon-seeding site for subsequent formation of Hemi-Spherical Grain (HSG) silicon. Amorphous silicon layer 40 is stripped from the upper surface of isolation material 30, by a method such as planarization. Then the amorphous silicon is etched back so that it is recessed below the top surface of opening 31 in isolation material 30 to ensure the subsequently formed storage node cell plate is physically isolated from any neighboring storage node cell plate in a memory array. The remaining amorphous silicon 40, defines a future storage node cell plate region that will reside in opening 31.

Referring now to FIG. 5, Hemi-Spherical Grain (HSG) silicon 51 is formed on amorphous silicon 40 by methods known to those skilled in the art. Typically, the formation of HSG silicon does not result in uniform silicon spheres and may instead be non-uniform silicon hemispheres with varying grain size and grain spacing. For example, as demonstrated in FIG. 5, a silicon seed 50 is deposited on amorphous silicon 40, using the amorphous silicon as a silicon-seeding site. As deposition continues, HSG silicon 51 develops into non-uniform silicon hemispheres with varying grain size and grain spacing.

Next, to father enhance the roughness of HSG silicon 51, epitaxial silicon 52 is grown on the HSG silicon to extend the size and shape of the silicon grain. For example, to enhance the roughness of the HSG silicon material, the epitaxial silicon is grown on the HSG silicon by decomposing DCS ($Si_2H_2Cl_2$) in an $H_2$/HCl environment at about 550 to 1000° C. A preferred epitaxial silicon thickness is approximately 100 Angstroms.

During epitaxial silicon deposition, the epitaxial silicon growth is promoted on the HSG silicon, but is inhibited from growing on isolation material 30. However, a small amount of epitaxial silicon 53 does in fact form on the exposed portions of isolation material 30, creating an unwanted epi-defect that could possibly provide an electrical path to a neighboring capacitor storage node plate. To ensure this defect is eliminated, first a hydrofluoric acid wet clean is used to remove any oxide that may have formed on the epitaxial silicon. Following the hydrofluoric acid wet clean (if needed), a chlorine etch is used to remove the epi-defect, but in doing so the epitaxial growth on the HSG silicon is somewhat reduced. However, the reduction of HSG silicon is minimal due to the small amount of epi-defect requiring removal. Thus, the chlorine etch has the added advantage of being able to control the epitaxial enhanced, HSG silicon grain size to obtain a desired overall rough surface for the storage node plate.

For example, the preferred epitaxial silicon deposition process (incorporating a chlorine etch) is conducted in a deposition chamber for a total of 5 cycles, with each cycle performed at a temperature of approximately 750–900° C. as follows. First, flow approximately 5–50 sccm of $Si_2H_6$ (flow for approximately 5–20 seconds), and then evacuate the chamber. Second, flow approximately 1–20 sccm of $Cl_2$ (flow for approximately 5–20 seconds), and then evacuate the chamber. Third, flow approximately 10–100 sccm of $H_2$ (flow for approximately 5–20 seconds), and then evacuate the chamber. The chamber may be evacuated by such methods as vacuum.

Referring now to FIG. 6, an enlarged view of region 54 in FIG. 5, demonstrates a major advantage gained by the addition of epitaxial silicon 52. The non-uniform silicon hemispheres with varying grain size and grain spacing of HSG silicon 41 show how the HSG silicon may form any shape of silicon grains from smaller grains, such as HSG silicon 51a, to larger grains, such as HSG silicon 51b, which may form both uniform or non-uniform hemi-spherical shapes. While the HSG silicon provides for a rough surface, a desirable characteristic for a storage plate of a capacitor due to increased storage plate surface area, the addition of epitaxial silicon 52 further increases the roughness (or overall textured surface) of the final storage plate.

However, the growth pattern of epitaxial silicon 52 varies according to the size and shape of the underlying hemi-spherical silicon due to the effects of a bonding energy that changes according to grain size. As seen in enlarged view of region 54, on the smaller hemi-spherical silicon grain, such as HSG silicon 51a, the epitaxial silicon 52a grows in a more vertical direction and grows less in a horizontal direction to form a somewhat oblong silicon shape from the center point silicon seed 50a. This result may be due to the bond energy being greater along the upper surface of the smaller HSG silicon grain, thus causing a greater growth of epitaxial silicon 52a in vertical direction away from the silicon seed 50a that graduates down to less growth of epitaxial silicon 52a in the horizontal direction.

In varying contrast, on a larger hemi-spherical silicon grain, such as HSG silicon 51b, the epitaxial silicon 52b growth is more uniform along the entire surface of HSG silicon 51b to form a rounded, more uniform silicon shape from the center point silicon seed 50b. This result may be due to the bond energy being substantially equal along the surface of the larger HSG silicon grain, thus causing an even growth of epitaxial silicon 52b on the surface of HSG silicon 51b and the growth being somewhat equidistant away from the silicon seed 50b.

The enlarged view of region 54 demonstrates in a visual respect how the overall surface area of the original HSG silicon 51 has been significantly increased by the addition of epitaxial silicon 52, which is a desired feature of the present invention when this process is utilized in semiconductor fabrication processes, such as formation of Dynamic Random Access Memory (DRAM) storage capacitors or other semiconductor devices that may benefit from enhanced electric charge storage capabilities.

Referring now to FIG. 7, a conformal storage cell dielectric 71, such as nitride, is formed over, preferably directly on, the epitaxial silicon covered HSG silicon storage node plate 70 and the exposed regions of bordering isolation material 30. Next, a storage node capacitor top plate 72, such as conductively doped polysilicon, is formed on the cell dielectric to complete the formation of a storage cell. The semiconductor assembly is then completed using fabrication methods know to those skilled in the arts.

A second exemplary embodiment of the present invention is depicted in FIGS. 2–3 and 8–10. A semiconductor assembly is prepared as depicted in FIGS. 2 and 3 as an opening 31 is etched into isolation material 30 to expose an underlying polysilicon plug 28, as previously describe in the first exemplary implementation of the present invention. The second implementation of the present invention continues with FIGS. 8–10.

Referring now to FIG. 8, a layer of deposited Hemi-Spherical Grain (HSG) silicon 81 is deposited on the exposed surfaces of isolation material 30 and the exposed surface of recessed polysilicon plug 28, by methods know to those skilled in the art. As discussed previously, typically the formation of HSG silicon does not result in uniform silicon spheres and may instead be non-uniform silicon hemi-spheres with varying grain size and grain spacing. As seen in FIG. 8, a silicon seed 80 is deposited on the exposed surfaces comprising isolation material 30, gate isolation material 26 (if exposed) and polysilicon plug 28. As deposition continues, HSG silicon 81 develops into non-uniform silicon hemispheres with varying grain size and grain spacing.

Next, to further enhance the roughness of HSG silicon 81, epitaxial silicon 82 is grown on the HSG silicon to extend the size and shape of the silicon grain. For example, to enhance the roughness of the HSG silicon material, the epitaxial silicon is grown on the HSG silicon by decomposing DCS ($Si_2H_2Cl_2$) in an H2 and HCl environment at about 550 to 1000° C. A preferred epitaxial silicon thickness is approximately 100 Angstroms.

Referring now to FIG. 9, an enlarged view of region 83, shown in FIG. 7, demonstrates a major advantage gained by the addition of epitaxial silicon 82. The non-uniform silicon hemispheres with varying grain size and grain spacing of HSG silicon 81 show how the HSG silicon may form any shape of silicon grains from smaller grains, such as HSG silicon 81a, to larger grains, such as HSG silicon 81b, which may form both uniform or non-uniform hemi-spherical shapes. While the HSG silicon provides for a rough surface, a desirable characteristic for a storage plate of a capacitor due to increased storage plate surface area, the addition of epitaxial silicon 82 further increase the roughness of the final storage plate, as evidenced by the epitaxial silicon growth of 82a and 82b. The different growth pattern of epitaxial silicon 82a and 82b is similar to the discussion of the epitaxial silicon growth described in the first exemplary implementation of the present invention and therefore not repeated.

The enlarged view of region 83 demonstrates, in a visual respect, how the overall surface area of the original HSG silicon 81 has been significantly increased by the addition of epitaxial silicon 82, which is a desired feature of the present invention when this process is utilized in semiconductor fabrication processes, such as formation of Dynamic Random Access Memory (DRAM) storage capacitors or other semiconductor devices that may benefit from enhanced electric charge storage capabilities.

Figure 10:
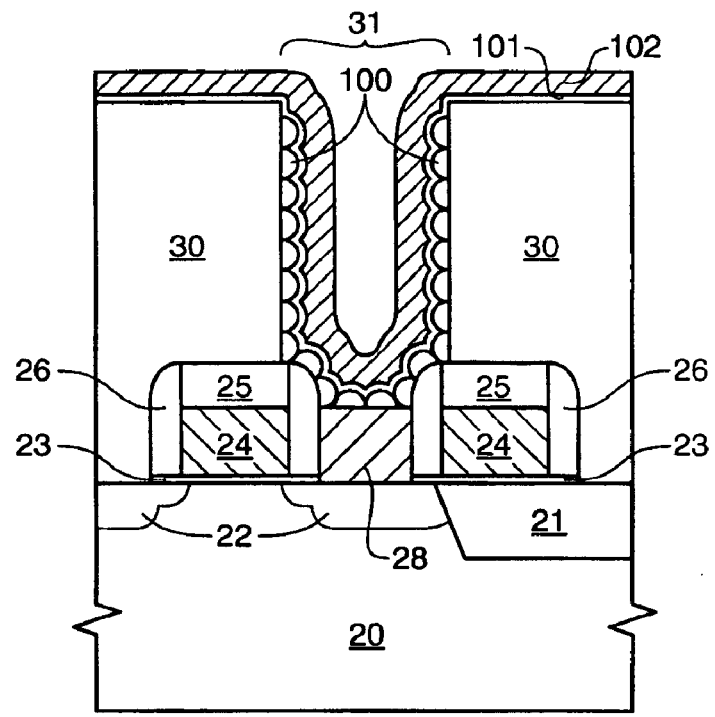
FIG. 10 is a cross-sectional view taken from FIG. 8 following the removal of the epitaxial hemi-spherical grain silicon that overlies the isolation region laying outside the desired storage node plate area followed by the formation of a conformal storage cell dielectric layer and the formation of a top storage cell electrode.

Referring now to FIG. 10, a conformal storage cell dielectric 101, such as nitride, is formed over, preferably directly on, the epitaxial silicon covered HSG silicon storage node plate 100 and the exposed regions of bordering isolation material 30. Next, a storage node capacitor top plate 102, such as conductively doped polysilicon, is formed on the cell dielectric to complete the formation of a storage cell. The semiconductor assembly is then completed using fabrication methods know to those skilled in the art.

Figure 11:
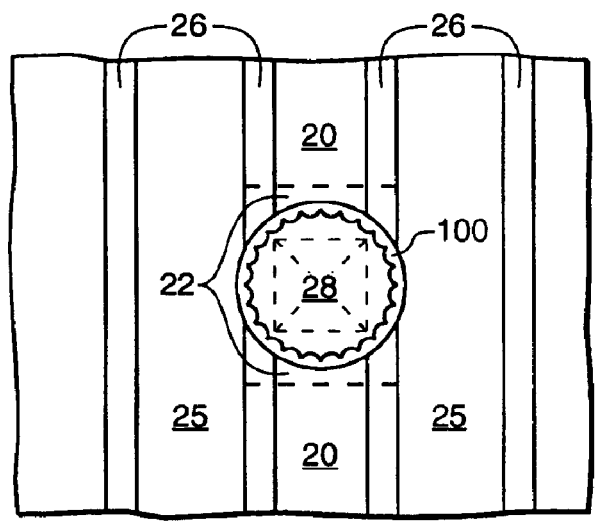
FIG. 11 is an overhead plan view of FIG. 10 showing a completed memory cell depicting an embodiment of the present invention.

FIG. 11 is an overhead plan view of FIG. 10 showing a completed memory cell depicting an embodiment of the present invention. In FIG. 11 the source/drain region 22 of a FET is imbedded in substrate 20. The FET gates (not seen) underlie isolation regions 25 and 26. Also shown is conductive plug 28 (shown by dashed lines) that makes contact to the underlying source/drain region 22 and overlying container storage node plate 100 (the epitaxial silicon covered HSG silicon storage node plate in fact covers the bottom of the plate). Isolation region 30, seen in FIG. 10, is not shown to allow for a basic overhead view of the regions of the underlying FET. If the isolation region was shown, it would surround storage node plate 100 and cover the underlying regions of the FETs.

Figure 12:
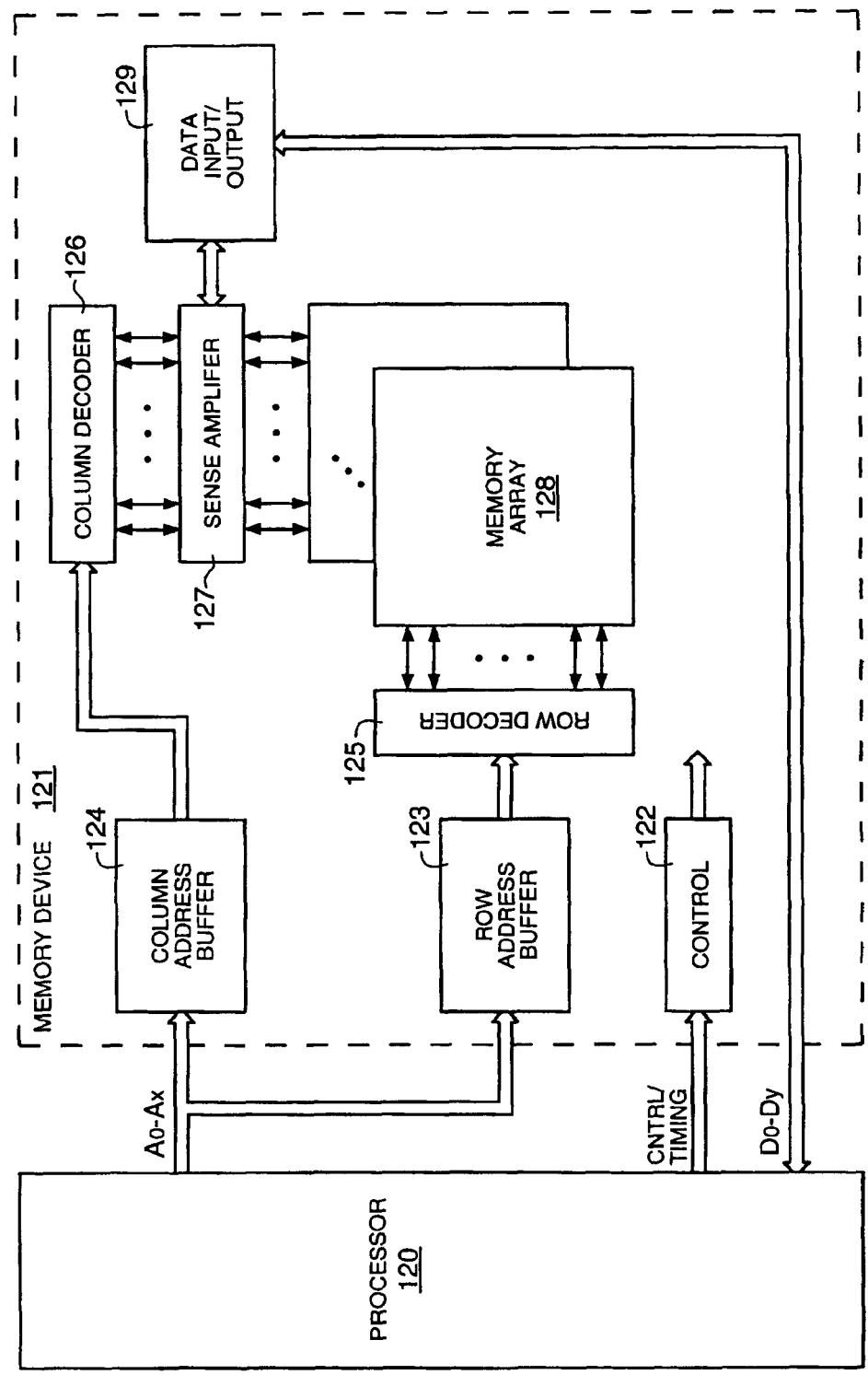
FIG. 12 is a simplified block diagram of a semiconductor system comprising a processor and memory device to which the present invention may be applied.

The present invention may be applied to a semiconductor system, such as the one depicted in FIG. 12, the general operation of which is known to one skilled in the art. FIG. 12 represents a general block diagram of a semiconductor system comprising a processor 120 and a memory device 121 showing the basic sections of a memory integrated circuit, such as row and column address buffers, 123 and 124, row and column decoders, 125 and 126, sense amplifiers 127, memory array 128 and data input/output 129, which are manipulated by control/timing signals from the processor through control 122.

It is to be understood that although the present invention has been described with reference to several preferred embodiments, various modifications, known to those skilled in the art, such as utilizing the disclosed methods to form DRAM storage capacitors or other semiconductor devices, may be made to the process steps presented herein without departing from the invention as recited in the several claims appended hereto.

U.S. Pat. No. 5,407,534, U.S. Pat. No. 5,418,180, U.S. Pat. No. 5,658,381, U.S. Pat. No. 5,721,171 and U.S. Pat. No. 6,448,129 contain disclosure concerning HSG silicon formation and are hereby incorporated by reference as if set forth in their entirety.

What is claimed is:

1. A method of forming a structure having a textured surface for a semiconductor assembly comprising:

forming hemi-spherical grain silicon over a supporting substrate; and forming epitaxial silicon directly on the hemi-spherical grain silicon, wherein the epitaxial silicon forms an oblong silicon shape that has more thickness in a vertical direction that graduates down to less thickness in a horizontal direction.

2. The method of claim 1, further comprising forming an amorphous silicon layer on the supporting substrate prior to the formation of the hemi-spherical grain silicon.

3. The method of claim 2, wherein the amorphous silicon layer is formed by decomposing $SiH_4$ at approximately 500° C.

4. The method of claim 2, wherein the amorphous silicon layer has a thickness of about 200 to 500 Angstroms.

5. The method of claim 1, wherein the hemi-spherical grain silicon is formed by decomposing DCS ($Si_2H_2Cl_2$) in an $H_2$ and HCl environment at about 550 to 1000° C.

6. The method of claim 1, wherein the epitaxial silicon thickness is approximately 100 Angstroms.

7. The method of claim 1, wherein the grain size of the epitaxial silicon is controlled by the number of cycles performed in a deposition chamber, with each cycle performed at a temperature of approximately 750–900° C. and further comprising:

flowing approximately 5–50 sccm of $Si_2H_6$ for approximately 5–20 seconds followed by a first evacuation of the chamber;

flowing approximately 1–20 sccm of $Cl_2$ for approximately 5–20 seconds followed by a second evacuation of the chamber; and flowing approximately 10–100 sccm of $H_2$ for approximately 5–20 seconds followed by a third evacuation of the chamber.

8. The method of claim 7, wherein the number of cycles performed is 5 cycles.

9. A method of forming a memory cell for a semiconductor assembly comprising:

forming an access transistor to a storage capacitor, forming a conductive plug connecting to a source/drain of the access transistor;

forming hemi-spherical grain silicon on the conductive plug; and forming epitaxial silicon directly on the hemi-spherical grain silicon, wherein the epitaxial silicon forms an oblong silicon shape that has more thickness in a vertical direction that graduates down to less thickness in a horizontal direction.

10. The method of claim 9, further comprising an amorphous silicon layer formed between the source/drain region of the access transistor and the conductive plug.

11. The method of claim 9, wherein the amorphous silicon layer has a thickness of about 200 to 500 Angstroms.

12. The method of claim 9, wherein the epitaxial silicon thickness is approximately 100 Angstroms.

13. The method of claim 9, wherein the grain size of the epitaxial silicon is controlled by the number of cycles performed in a deposition chamber, with each cycle performed at a temperature of approximately 750–900° C. and further comprising:

flowing approximately 5–50 sccm of $Si_2H_6$ for approximately 5–20 seconds followed by a first evacuation of the chamber;

flowing approximately 1–20 sccm of $Cl_2$ for approximately 5–20 seconds followed by a second evacuation of the chamber; and flowing approximately 10–100 sccm of $H_2$ for approximately 5–20 seconds followed by a third evacuation of the chamber.

14. The method of claim 13, wherein the number of cycles performed is 5 cycles.

15. A method of forming a storage node capacitor plate for a semiconductor assembly comprising:

forming hemi-spherical grain silicon directly connecting to an underlying conductive material; and forming epitaxial silicon directly on the hemi-spherical grain silicon, wherein the epitaxial silicon forms an oblong silicon shape that has more thickness in a vertical direction that graduates down to less thickness in a horizontal direction.

16. The method of claim 15, further comprising an amorphous silicon layer formed between the source/drain region of the access transistor and the conductive plug.

17. The method of claim 15, wherein the hemi-spherical grain silicon is formed by decomposing DCS ($Si_2H_2Cl_2$) in an $H_2$ and HCl environment at about 800 to 1000° C.

18. The method of claim 15, wherein the epitaxial silicon thickness is approximately 100 Angstroms.

19. The method of claim 15, wherein the grain size of the epitaxial silicon is controlled by the number of cycles performed in a deposition chamber, with each cycle performed at a temperature of approximately 750–900° C. and further comprising:

flowing approximately 5–50 sccm of $Si_2H_6$ for approximately 5–20 seconds followed by a first evacuation of the chamber;

flowing approximately 1–20 sccm of $Cl_2$ for approximately 5–20 seconds followed by a second evacuation of the chamber; and flowing approximately 10–100 sccm of $H_2$ for approximately 5–20 seconds followed by a third evacuation of the chamber.

20. The method of claim 19, wherein the number of cycles performed is 5 cycles.

21. A method of forming a capacitor structure for a semiconductor assembly during fabrication thereof comprising:

forming hemispherical grain silicon directly connecting to an underlying conductive material;

forming epitaxial silicon directly on the hemi-spherical grain silicon, wherein the epitaxial silicon forms an oblong silicon shape that has more thickness in a vertical direction that graduates down to less thickness in a horizontal direction;

removing undesired regions of the hemi-spherical grain silicon and the epitaxial silicon to form a storage node capacitor plate;

forming a capacitor dielectric over the storage node capacitor plate; and forming a capacitor top plate over the capacitor dielectric.

22. The method of claim 21, further comprising an amorphous silicon layer formed between the source/drain region of the access transistor and the conductive plug.

23. A semiconductor structure with a textured-surface for a semiconductor assembly comprising:
a hemi-spherical grain silicon on a supporting substrate; and
an epitaxial silicon directly on the hemi-spherical grain silicon, wherein the epitaxial silicon is an oblong silicon shape that has more thickness in a vertical direction that graduates down to less thickness in a horizontal direction.

24. The semiconductor structure of claim 23, further comprising an amorphous silicon layer underlying the hemi-spherical grain silicon.

25. The semiconductor structure of claim 24, wherein the amorphous silicon layer has a thickness of about 200 to 500 Angstroms.

26. The semiconductor structure of claim 23, wherein the epitaxial silicon thickness is approximately 100 Angstroms.

27. A memory cell for a semiconductor assembly comprising:
an access transistor to a storage capacitor;
a conductive plug connecting to a source/drain of the access transistor;
a hemi-spherical grain silicon overlying the conductive plug; and
an epitaxial silicon directly on the hemi-spherical grain silicon, wherein the epitaxial silicon is an oblong silicon shape that has more thickness in a vertical direction that graduates down to less thickness in a horizontal direction.

28. The memory cell of claim 27, further comprising an amorphous silicon layer between the source/drain region of the access transistor and the conductive plug.

29. A capacitor plate for a semiconductor assembly comprising:
a hemi-spherical grain silicon connecting to a conductive material; and
an epitaxial silicon directly on the hemi-spherical grain silicon, wherein the epitaxial silicon is an oblong silicon shape that has more thickness in a vertical direction that graduates down to less thickness in a horizontal direction.

30. The capacitor plate of claim 29, wherein the conductive material comprises an underlying conductive polysilicon plug.

31. The capacitor plate of claim 29, wherein the conductive material comprises an amorphous silicon layer directly connecting to an underlying conductive polysilicon plug.

32. The capacitor plate of claim 31, wherein the amorphous silicon layer has a thickness of about 200 to 500 Angstroms.

33. The capacitor plate of claim 29, wherein the epitaxial silicon thickness is approximately 100 Angstroms.

34. A semiconductor assembly having a capacitor structure comprising;
an isolation material having a hole therein;
a hemi-spherical grain silicon residing in the hole and connecting to a conductive material;
an epitaxial silicon directly on the hemi-spherical grain silicon, wherein the epitaxial silicon is an oblong silicon shape that has more thickness in the vertical direction that graduates down to less thickness in the horizontal direction;
a capacitor dielectric overlying the epitaxial silicon; and
a capacitor plate overlying the capacitor dielectric.

35. The semiconductor assembly of claim 34, wherein the conductive material comprises an underlying conductive polysilicon plug.

36. The semiconductor assembly of claim 34, wherein the conductive material comprises an amorphous silicon layer directly connecting to an underlying conductive polysilicon plug.

37. A method of forming a structure having a textured surface for a semiconductor assembly comprising:
forming hemi-spherical grain silicon over a supporting substrate; and
forming epitaxial silicon directly on the hemispherical grain silicon, wherein the grain size of the epitaxial silicon is controlled by the number of cycles performed in a deposition chamber, with each cycle performed at a temperature of approximately 750–900° C. and further comprising:
flowing approximately 5–50 sccm of $Si_2H_6$ for approximately 5–20 seconds followed by a first evacuation of the chamber;
flowing approximately 1–20 sccm of $Cl_2$ for approximately 5–20 seconds followed by a second evacuation of the chamber; and
flowing approximately 10–100 sccm of $H_2$ for approximately 5–20 seconds followed by a third evacuation of the chamber.

38. The method of claim 37, further comprising forming an amorphous silicon layer on the supporting substrate prior to the formation of the hemi-spherical grain silicon.

39. The method of claim 38, wherein the amorphous silicon layer is formed by decomposing $SiH_4$ at approximately 500° C.

40. The method of claim 38, wherein the amorphous silicon layer has a thickness of about 200 to 500 Angstroms.

41. The method of claim 37, wherein the hemi-spherical grain silicon is formed by decomposing DCS ($Si_2H_2Cl_2$) in an $H_2$ and HCl environment at about 550 to 10001° C.

42. The method of claim 37, wherein the epitaxial silicon thickness is approximately 100 Angstroms.

43. The method of claim 37, wherein the number of cycles performed is 5 cycles.

44. The method of claim 37, wherein the epitaxial silicon forms an oblong silicon shape that has more thickness in a vertical direction that graduates down to less thickness in a horizontal direction.

45. A method of forming a memory cell for a semiconductor assembly comprising:
forming an access transistor to a storage capacitor;
forming a conductive plug connecting to a source/drain of the access transistor;
forming hemispherical grain silicon on the conductive plug; and forming epitaxial silicon directly on the hemi-spherical grain silicon, wherein the grain size of the epitaxial silicon is controlled by the number of cycles performed in a deposition chamber, with each cycle performed at a temperature of approximately 750–900° C. and further comprising:

flowing approximately 5–50 sccm of $Si_2H_6$ for approximately 5–20 seconds followed by a first evacuation of the chamber;

flowing approximately 1–20 sccm of $Cl_2$ for approximately 520 seconds followed by a second evacuation of the chamber; and flowing approximately 10–100 sccm of $H_2$ for approximately 520 seconds followed by a third evacuation of the chamber.

46. The method of claim 45, further comprising an amorphous silicon layer formed between the source/drain region of the access transistor and the conductive plug.

47. The method of claim 46, wherein the amorphous silicon layer has a thickness of about 200 to 500 Angstroms.

48. The method of claim 45, wherein the epitaxial silicon thickness is approximately 100 Angstroms.

49. The method of claim 45, wherein the number of cycles performed is 5 cycles.

50. The method of claim 45, wherein the epitaxial silicon forms an oblong silicon shape that has more thickness in a vertical direction that graduates down to less thickness in a horizontal direction.

51. A method of forming a storage node capacitor plate for a semiconductor assembly comprising:

forming hemi-spherical grain silicon directly connecting to an underlying conductive material; and forming epitaxial silicon directly on the hemi-spherical grain silicon, wherein the grain size of the epitaxial silicon is controlled by the number of cycles performed in a deposition chamber, with each cycle performed at a temperature of approximately 750–900° C. and further comprising:

flowing approximately 5–50 sccm of $Si_2H_6$ for approximately 520 seconds followed by a first evacuation of the chamber;

flowing approximately 1–20 sccm of $Cl_2$ for approximately 520 seconds followed by a second evacuation of the chamber; and flowing approximately 10–100 sccm of $H_2$ for approximately 520 seconds followed by a third evacuation of the chamber.

52. The method of claim 51, further comprising an amorphous silicon layer formed between the source/drain region of the access transistor and the conductive plug.

53. The method of claim 51, wherein the hemi-spherical grain silicon is formed by decomposing DCS ($Si_2H_2Cl_2$) in an $H_2$ and HCl environment at about 800 to 100° C.

54. The method of claim 51, wherein the epitaxial silicon thickness is approximately 100 Angstroms.

55. The method of claim 51, wherein the number of cycles performed is 5 cycles.

56. The method of claim 51, wherein the epitaxial silicon forms an oblong silicon shape that has more thickness in a vertical direction that graduates down to less thickness in a horizontal direction.

57. A method of forming a capacitor structure for a semiconductor assembly during fabrication thereof comprising:

forming hemi-spherical grain silicon directly connecting to an underlying conductive material;

forming epitaxial silicon directly on the hemi-spherical grain silicon, wherein the grain size of the epitaxial silicon is controlled by the number of cycles performed in a deposition chamber, with each cycle performed at a temperature of approximately 750–900° C. and further comprising:

flowing approximately 5–50 sccm of $Si_2H_6$ for approximately 520 seconds followed by a first evacuation of the chamber;

flowing approximately 1–20 sccm of $Cl_2$ for approximately 520 seconds followed by a second evacuation of the chamber; and flowing approximately 10–100 sccm of $H_2$ for approximately 520 seconds followed by a third evacuation of the chamber;

removing undesired regions of the hemi-spherical grain silicon and the epitaxial silicon to form a storage node capacitor plate;

forming a capacitor dielectric over the storage node capacitor plate; and forming a capacitor top plate over the capacitor dielectric.

58. The method of claim 57, further comprising an amorphous silicon layer formed between the source/drain region of the access transistor and the conductive plug.

59. The method of claim 57, wherein the epitaxial silicon forms an oblong silicon shape that has more thickness in a vertical direction that graduates down to less thickness in a horizontal direction.

* * * * *